US010396240B2

(12) United States Patent
Yeh et al.

(10) Patent No.: US 10,396,240 B2
(45) Date of Patent: Aug. 27, 2019

(54) III-NITRIDE SEMICONDUCTOR LIGHT EMITTING DEVICE HAVING AMBER-TO-RED LIGHT EMISSION (>600 NM) AND A METHOD FOR MAKING SAME

(71) Applicant: Ostendo Technologies, Inc., Carlsbad, CA (US)

(72) Inventors: Yea-Chuan Milton Yeh, Santa Monica, CA (US); Hussein S. El-Ghoroury, Carlsbad, CA (US); Xing Li, West Covina, CA (US); Jyh-Chia Chen, Yorba Linda, CA (US); Chih-Li Chuang, San Diego, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 15/287,384

(22) Filed: Oct. 6, 2016

(65) Prior Publication Data

US 2017/0104128 A1    Apr. 13, 2017

Related U.S. Application Data

(60) Provisional application No. 62/239,122, filed on Oct. 8, 2015.

(51) Int. Cl.
| | |
|---|---|
| *H01L 29/15* | (2006.01) |
| *H01L 31/0256* | (2006.01) |
| *H01L 33/06* | (2010.01) |
| *H01L 33/02* | (2010.01) |
| *H01L 33/12* | (2010.01) |
| *H01L 33/30* | (2010.01) |
| *H01L 33/00* | (2010.01) |
| *H01L 33/32* | (2010.01) |

(52) U.S. Cl.
CPC .......... *H01L 33/06* (2013.01); *H01L 33/0075* (2013.01); *H01L 33/02* (2013.01); *H01L 33/12* (2013.01); *H01L 33/30* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 4,839,899 A | 6/1989 | Burnham et al. | |
| 5,386,428 A | 1/1995 | Thornton et al. | |
| 5,422,898 A | 6/1995 | Kash et al. | |
| 5,737,353 A | 4/1998 | Sasaki | |
| 5,851,905 A | 12/1998 | McIntosh et al. | |
| 5,929,462 A | 7/1999 | Kasukawa et al. | |
| 6,434,178 B1 | 8/2002 | Ubukata | |
| 6,469,358 B1 | 10/2002 | Martin | |
| 6,858,869 B2 | 2/2005 | Fujiwara | |
| 6,919,584 B2 | 7/2005 | Wang et al. | |
| 7,058,105 B2 | 6/2006 | Lee et al. | |
| 7,084,436 B2 | 8/2006 | DenBaars et al. | |
| 7,323,721 B2 | 1/2008 | Liao et al. | |
| 7,623,560 B2 | 11/2009 | El-Ghoroury et al. | |
| 7,767,479 B2 | 8/2010 | El-Ghoroury et al. | |
| 7,829,902 B2 | 11/2010 | El-Ghoroury et al. | |
| 8,049,231 B2 | 11/2011 | El-Ghoroury et al. | |
| 8,243,770 B2 | 8/2012 | El-Ghoroury et al. | |
| 8,314,429 B1 | 11/2012 | Raring et al. | |
| 8,451,877 B1 | 5/2013 | Crawford et al. | |
| 8,455,917 B2 | 6/2013 | Nago et al. | |
| 8,567,960 B2 | 10/2013 | El-Ghoroury et al. | |
| 9,847,444 B2 | 12/2017 | Suga et al. | |

(Continued)

FOREIGN PATENT DOCUMENTS

| | | |
|---|---|---|
| EP | 2610927 | 7/2013 |
| WO | WO-00/058999 | 10/2000 |
| WO | WO-2016/197062 | 12/2016 |

OTHER PUBLICATIONS

"International Search Report and Written Opinion of the International Searching Authority dated Nov. 29, 2016; International Application No. PCT/US2016/056157", (Nov. 29, 2016).

Beeler, M., et al., "III-nitride semiconductors for intersubband optoelectronics: a review", *Semiconductor Science and Technology*, vol. 28, 074022, (2013), pp. 1-26.

Bour, David P., et al., "AlGaInN MQW Laser Diodes", *Chapter 10 of III-V Nitride Semiconductors: Applications & Devices*, Edited by E. T. Yu and M. O. Manasreh, Taylor & Francis Books, Inc., (2003), pp. 439-502.

Bulashevich, K. A., et al., "Is Auger recombination responsible for the efficiency rollover in III-nitride light-emitting diodes?", *Physica Status Solidi C*, vol. 5, No. 6, (2008), pp. 2066-2069.

(Continued)

*Primary Examiner* — Calvin Y Choi
(74) *Attorney, Agent, or Firm* — Womble Bond Dickinson (US) LLP

(57) ABSTRACT

A III-nitride semiconductor light emitting device incorporating n-type III-nitride cladding layers, indium containing III-nitride light emitting region, and p-type III-nitride cladding layers. The light emitting region is sandwiched between n- and p-type III-nitride cladding layers and includes multiple sets of multi-quantum-wells (MQWs). The first MQW set formed on the n-type cladding layer comprises relatively lower indium concentration. The second MQW set comprising relatively moderate indium concentration. The third MQW set adjacent to the p-type cladding layer incorporating relatively highest indium concentration of the three MQW sets and is capable of emitting amber-to-red light. The first two MQW sets are utilized as pre-strain layers. Between the MQW sets, intermediate strain compensation layers (ISCLs) are added. The combination of the first two MQW sets and ISCLs prevent phase separation and enhance indium uptake in the third MQW set. The third MQW set, as a result, retains sufficiently high indium concentration to emit amber-to-red light of high output power without any phase separation associated problems.

22 Claims, 5 Drawing Sheets

(56) References Cited

U.S. PATENT DOCUMENTS

| | | | |
|---|---|---|---|
| 9,985,174 | B2 | 5/2018 | El-Ghoroury et al. |
| 2003/0218180 | A1 | 11/2003 | Fujiwara |
| 2004/0051107 | A1 | 3/2004 | Nagahama et al. |
| 2004/0125839 | A1 | 7/2004 | Lee et al. |
| 2004/0161006 | A1* | 8/2004 | Chang .................. B82Y 20/00 372/45.011 |
| 2004/0183088 | A1 | 9/2004 | DenBaars et al. |
| 2004/0256626 | A1 | 12/2004 | Wang et al. |
| 2005/0145857 | A1 | 7/2005 | Maruyama et al. |
| 2006/0049415 | A1 | 3/2006 | Liao et al. |
| 2007/0183469 | A1 | 8/2007 | Ryu |
| 2007/0241676 | A1 | 10/2007 | Park et al. |
| 2007/0291808 | A1 | 12/2007 | Ledentsov et al. |
| 2008/0124827 | A1 | 5/2008 | Huang et al. |
| 2008/0149917 | A1 | 6/2008 | Park |
| 2008/0273566 | A1 | 11/2008 | Nishinaka et al. |
| 2009/0045392 | A1 | 2/2009 | Park et al. |
| 2009/0086170 | A1 | 4/2009 | El-Ghoroury et al. |
| 2009/0179191 | A1 | 7/2009 | Smith et al. |
| 2009/0250686 | A1 | 10/2009 | Sato et al. |
| 2009/0278998 | A1 | 11/2009 | El-Ghoroury et al. |
| 2010/0003777 | A1 | 1/2010 | El-Ghoroury et al. |
| 2010/0006873 | A1 | 1/2010 | Raring et al. |
| 2010/0066921 | A1 | 3/2010 | El-Ghoroury et al. |
| 2010/0158064 | A1 | 6/2010 | Takahashi et al. |
| 2010/0189148 | A1 | 7/2010 | Kyono et al. |
| 2010/0220042 | A1 | 9/2010 | El-Ghoroury et al. |
| 2010/0301319 | A1 | 12/2010 | Kuma et al. |
| 2011/0095291 | A1 | 4/2011 | Quitoriano |
| 2011/0186823 | A1 | 8/2011 | Yen et al. |
| 2011/0188528 | A1 | 8/2011 | Kisin et al. |
| 2011/0237011 | A1 | 9/2011 | Zhang et al. |
| 2012/0008660 | A1* | 1/2012 | Fujii .................. B82Y 20/00 372/45.01 |
| 2012/0033113 | A1 | 2/2012 | El-Ghoroury et al. |
| 2012/0049157 | A1 | 3/2012 | Nago et al. |
| 2012/0295422 | A1 | 11/2012 | Jiang et al. |
| 2012/0313076 | A1 | 12/2012 | Nakamura et al. |
| 2013/0056785 | A1 | 3/2013 | Hwang |
| 2013/0075696 | A1* | 3/2013 | Hsieh .................. H01L 33/06 257/13 |
| 2013/0082238 | A1 | 4/2013 | Hsieh et al. |
| 2013/0243024 | A1 | 9/2013 | Hara |
| 2013/0250986 | A1* | 9/2013 | Wunderer .......... H01S 5/02461 372/36 |
| 2014/0103290 | A1 | 4/2014 | Yen et al. |
| 2014/0166978 | A1 | 6/2014 | Shioda et al. |
| 2014/0175440 | A1 | 6/2014 | Mohammed et al. |
| 2015/0213747 | A1 | 7/2015 | Adamovich et al. |
| 2015/0255669 | A1 | 9/2015 | Han et al. |
| 2016/0027961 | A1 | 1/2016 | Mi et al. |
| 2016/0359084 | A1 | 12/2016 | El-Ghoroury et al. |
| 2016/0359086 | A1 | 12/2016 | El-Ghoroury et al. |
| 2016/0359299 | A1 | 12/2016 | El-Ghoroury et al. |
| 2016/0359300 | A1 | 12/2016 | El-Ghoroury et al. |

OTHER PUBLICATIONS

Domen, K., et al., "Interwell inhomogeneity of carrier injection in InGaN/GaN/AlGaN multiquantum well lasers", *Applied Physics Letters*, vol. 73, No. 19, (Nov. 9, 1998), pp. 2775-2777.

Dutta, N. K., "Current Injection in Multiquantum Well Lasers", *IEEE Journal of Quantum Electronics*, vol. QE-19, No. 5, (May 1983), pp. 794-797.

Hong, Young J., et al., "Visible-Color-Tunable Ligh-Emitting Diodes", *Advanced Materials*, vol. 23, No. 9, (2011), pp. 3284-3288.

Hwang, Jong-Il, et al., "Development of InGaN-based red LED grown on (0001) polar surface", *Applied Physics Express*, vol. 7, (2014), pp. 071003-1 to 071003-4.

Kim, Min-Ho, et al., "Origin of efficiency droop in GaN-based light-emitting diodes", *Applied Physics Letters*, vol. 91, No. 18, (2007), pp. 183507-1 to 183407-3.

Kisin, Mikhail V., et al., "Inhomogeneous injection in III-nitride light emitters with deep multiple quantum wells", *Journal of Computational Electronics*, vol. 14, No. 2, (2015), pp. 432-443.

Kisin, Mikhail V., et al., "Modeling of III-Nitride Multiple-Quantum-Well Light-Emitting Structures", *IEEE Journal of Selected Topics in Quantum Electronics*, vol. 19, No. 5, (2013), pp. 1-10.

Kisin, Mikhail V., et al., "Non-equilibrium quantum well populations and active region inhomogeneity in polar and nonpolar III-nitride light emitters", *Journal of Applied Physics*, vol. 111, (2012), pp. 103113-1 to 103113-9.

Laubsch, Ansgar, et al., "On the origin of IQE-'droop' in InGaN LEDs", *Physica Status Solidi C*, vol. 6, No. 52, (2009), pp. S913-S916.

Li, X., et al., "The effects of thin capping layers between quantum wells and barriers on the quantum efficiency enhancement in InGaN-based light emitting diodes", *Applied Physics Letters*, vol. 103, (2013), pp. 111103-1 to 111103-4.

Mukai, Takashi, et al., "Characteristics of InGaN-Based UV/Blue/Green/Amber/Red Light-Emitting Diodes", *Jpn. J. Appl. Phys.*, vol. 38, Part 1, No. 7A, (Jul. 1999), pp. 3976-3981.

Nakamura, Shuji, et al., "Candela-class high-brightness InGaN/AlGaN double-heterostructure blue-light-emitting diodes", *Applied Physics Letters*, vol. 64, No. 13, (Mar. 28, 1994), pp. 1687-1689.

Nakamura, Shuji, et al., "High-brightness InGaN/AlGaN double-heterostructure blue-green-light-emitting diodes", *Journal of Applied Physics*, vol. 76, No. 12, (Dec. 15, 1994), pp. 8189-8191.

Nakamura, Shuji, et al., "Ridge-geometry InGaN multi-quantum-well-structure laser diodes", *Applied Physics Letters*, vol. 69, No. 10, (Sep. 2, 1996), pp. 1477-1479.

Schubert, E. F., "Light-Emitting Diodes", Cambridge University Press, (2003), pp. 1-16.

Sekiguchi, Hiroto, et al., "Emission color control from blue to red with nanocolumn diameter of InGaN/GaN nanocolumn arrays grown on same substrate", *Applied Physics Letters*, vol. 96, (2010), pp. 231104-1 to 231104-3.

Shatalov, Max, et al., "High power AlGaN ultraviolet light emitters", *Semiconductor Science and Technology*, vol. 29, 084007, (2014), pp. 1-6.

Strittmatter, Andre, et al., "Semi-polar nitride surfaces and heterostructures", *Physica Status Solidi B*, vol. 248, No. 3, (2011), pp. 561-573.

Suchalkin, S., et al., "Mechanism of the temperature sensitivity of mid-infrared GaSb-based semiconductor lasers", *Applied Physics Letters*, vol. 87, No. 4, (2005), pp. 041102-1 to 041102-3.

Tessler, N., et al., "Distributed nature of quantum-well lasers", *Applied Physics Letters*, vol. 62, No. 1, (Jan. 4, 1993), pp. 10-12.

Verzellesi, Giovanni, et al., "Efficiency droop in InGaN/GaN blue light-emitting diodes: Physical mechanisms and remedies", *Journal of Applied Physics*, vol. 114, No. 7, (2013), pp. 071101-1 to 071101-14.

Waltereit, P., et al., "Nitride semiconductors free of electrostatic fields for efficient white light-emitting diodes", *Nature*, vol. 406, (Aug. 24, 2000), pp. 865-868.

Xie, Jinqiao, et al., "On the efficiency droop in InGaN multiple quantum well blue light emitting diodes and its reduction with p-doped quantum well barriers", *Applied Physics Letters*, vol. 93, (2008), pp. 121107-1 to 121107-3.

Zhao, B., et al., "Effect of state filling on the modulation response and the threshold current of quantum well lasers", *Applied Physics Letters*, vol. 60, No. 16, (Apr. 20, 1992), pp. 1930-1932.

Franciosi, Alfonso, et al., "Heterojunction band offset engineering", *Surface Science Reports*, vol. 25, No. 1, (Oct. 1996), pp. 1-140.

Vurgaftman, I., et al., "Band parameters for III-V compound semiconductors and their alloys", *Journal of Applied Physics*, vol. 89, No. 11, (Jun. 1, 2001), pp. 5815-5875.

Wikipedia, "Band offset", https://en.wikipedia.org/w/index.php?title=Band_offset&oldid=532056869, (created Jan. 26, 2007; last edited Jan. 28, 2013), 1 pg. total.

Display Daily, "Ostendo Develops First Vertically Integrated RGB LED", downloaded from https://www.displaydaily.com/index.php?option=com_content&view=article&id=48285:ostendo-develops-first-vertically-integrated-rgb-led&catid=152:display-daily&Itemid=1016, 2017, 8 pp. total.

(56) References Cited

OTHER PUBLICATIONS

El-Ghoroury, Hussein S. et al., "Growth of monolithic full-color GaN-based LED with intermediate carrier blocking layers", AIP Advances, vol. 6, 2016, pp. 075316-1 to 075316-6.
Chen, Jyh-Chia et al., "The World's First Monolithic Full-Colour LED", Compound Semiconductor, vol. 22, Issue 8, Nov./Dec. 2016, pp. 44-47.
El-Ghoroury, Hussein S. et al., "III-nitride monolithic LED covering full RGB color gamut", Proceedings of the SPIE, Physics and Simulation of Optoelectronic Devices XXIV, vol. 9742, 2016, pp. 974222-1 to 974222-8.
Stevenson, Dr. Richard, "Viewpoint—Full colour GaN", Compound Semiconductor, vol. 22, Issue 8, Nov./Dec. 2016, p. 3.

* cited by examiner

III-NITRIDE SEMICONDUCTOR LIGHT EMITTING DEVICE HAVING AMBER-TO-RED LIGHT EMISSION (>600 NM) AND A METHOD FOR MAKING SAME

CROSS-REFERENCE TO RELATED APPLICATIONS

This application claims the benefit of U.S. Provisional Patent Application No. 62/239,122 filed Oct. 8, 2015.

BACKGROUND OF THE INVENTION

1. Field of the Invention

The invention herein relates generally to a III-nitride semiconductor light emitting device that emits visible light in the amber-to-red region. A method to manufacture the same is disclosed.

2. Prior Art

Prior art III-nitride based blue light emitting structures, such as light diodes (LEDs) and laser diodes (LD), (for the sake of brevity, LEDs and LDs may each be referred to as LEDs herein) are commercially available with peak external quantum efficiency (EQE) exceeding 80%. Operating in green spectral region, the EQE of prior art LEDs drops below half that of blue LEDs. The EQE of III-nitride semiconductor light emitters, very abruptly drops even more so toward the amber and red spectra region. There are two common reasons for the efficiency loss in III-nitride light emitters: (1) a large lattice mismatch between InGaN and GaN layers of the III-nitride light emitting structure where the miscibility becomes prominent with the much higher indium concentration required for longer wavelengths; and, (2) InGaN QWs grown on c-plane polar GaN inevitably suffer from quantum-confined Stark effect (QCSE) resulting from a strong piezoelectric field, which in turn causes a reduction in the radiative recombination rate, especially in the long wavelength regions where higher indium concentration is required.

Although it is difficult to achieve InGaN-based long wavelengths (amber-to-red at wavelengths greater than 600 nm) in III-nitride light emitting devices, such as LEDs for example, such devices are very desirable in order to realize single chip, solid state lighting and monolithic multi-color light modulating devices (see U.S. Patent Application Publication Nos. 2016/0359084, 2016/0359086, 2016/0359299 and 2016/0359300). Moreover, the device performance of InGaN-based light emitting structure, such as LEDs and LDs, are less temperature dependent due to the higher bandgap offset than that of other long wavelength light emitting structures such as light emitters based on an AlInGaP material system. In addition, a GaN-based red wavelength emitting LED material structure is beneficially temperature-expansion matched to GaN-based blue and green LEDs, which makes it compatible with GaN-based stacked LED light emitting structures that use wafer bonding to create multi-color solid state light emitters (see U.S. Pat. Nos. 7,623,560, 7,767,479 and 7,829,902). Thus, InGaN-based long wavelength light emitting structures, such as LEDs and LDs, can be superior in many applications.

Within the field of prior art InGaN-based red wavelength light emitters, such as LEDs or LDs, that are grown along the crystalline c-axis, all exhibit "phase separation" (also known to a person skilled in the art as indium segregation) due to poor material quality, see for example R. Zhang et al. in U.S. Pat. App. Publ. 20110237011A1 entitled "Method for forming a GaN-based quantum well LED with red light" and Jong-Il Hwang et al in App. Phys. Express 7, 071003 (2015) entitled "Development of InGaN-based red LED grown on (0001) polar surface". This phase separation manifests itself as one or more extra emission peaks in shorter wavelength regions on the spectra, which inevitably reduces color purity as shown in FIGS. 2(b) and (c). Therefore, approaches for increasing indium incorporation while not compromising material quality and device performance are critical to achieve long wavelength emission, amber-to-red, III-nitride based light emitting structures, such as LEDs and LDs. The methods and devices disclosed herein pave the way for high performance, long wavelength III-nitride semiconductor light emitting devices for use in solid state lighting, display systems and many other applications that require greater than 600 nm wavelength solid state light emitters.

BRIEF DESCRIPTION OF THE DRAWINGS

Hereinafter, various embodiments will be described with reference to the drawings, wherein the same reference characters denote the same or similar portions throughout the several views.

DETAILED DESCRIPTION OF THE PREFERRED EMBODIMENTS

Figure 1:
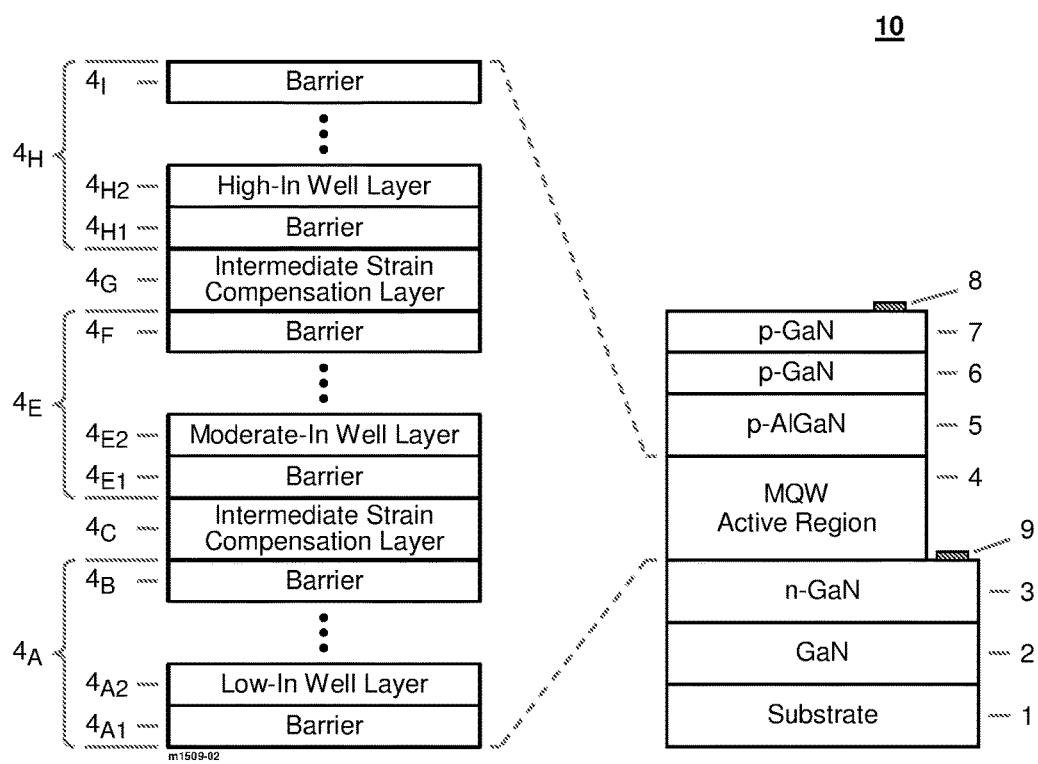
FIG. 1 is a cross-sectional view of a portion of an illustrative, but non-limitative, embodiment of a III-nitride semiconductor LED device 10 according to the present disclosure.

The invention relates to long wavelength light emission III-nitride based semiconductor light emitting structures, such as LEDs and LDs, fabricated by means of manipulating the crystalline strain inside the light emitting active region of the structure during the epitaxial growth process. Herein and without limitation, the III-nitride semiconductor light emitter structure of this invention is illustrated within the context of an LED device structure, however a person skilled in the art will recognize how to apply the methods of this invention to the design of other III-nitride semiconductor light emitters including without limitation, LDs.

The present invention discloses an innovative method of fabricating III-nitride based light emitting structures, such as LEDs or LDs that do not suffer from excessive phase separation and thus are capable of emitting amber-to-red light with high spectral purity. Additional advantages and other features of the present invention are set forth in the description which follows and in part will become apparent to those having ordinary skill in the art upon examination of the following or may be learned from the practice of the present invention. The advantages may be realized and obtained as particularly pointed out in subsequent claims of any application claiming priority to the instant application.

According to one embodiment of this invention, in a III-nitride semiconductor light emitting diode (LED) structure, a first cladding layer is comprised of an n-type III-nitride semiconductor layer. A light emitting active region is formed on the n-type cladding layer that includes indium containing III-nitride layers. A p-type AlGaN is formed on the light emitting active region functioning as electron blocking layer (EBL). Then a second p-type III-nitride cladding layer is formed on the AlGaN layer.

According to a further embodiment of this invention, the light emitting region of the III-nitride light emitter comprises a plurality of multiple quantum wells (MQW) sets separated by one or more intermediate strain compensation layers (hereinafter, referred to as ISCLs) to minimize the crystalline strain. The plurality of MQW sets and/or the ISCLs may be vertically stacked on a surface of a substrate, thereby forming a multilayer stack of MQW sets on the substrate. The multilayer stack may include a $1^{st}$ MQW set comprising GaN/InGaN with lower indium concentration, a $2^{nd}$ MQW set comprising GaN/InGaN with moderate indium concentration and higher than the indium concentration of the $1^{st}$ MQW set and a $3^{rd}$ MQW set comprising GaN/InGaN with the highest indium concentration capable of emitting the desired amber-to-red wavelength light. The first two MQW sets are utilized to produce the pre-strain effect on the above III-nitride semiconductor layers of the III-nitride light emitting structure. However, herein more than two MQW sets with variable indium concentration may be used to generate an equivalent pre-strain effect as the two MQW sets do, which is exhibited as a non-limiting example in the present disclosure. In addition, AlGaN layers are inserted as intermediate strain compensation layers (ISCLs) to minimize the total strain in the light emitting region. Through the combination of two (in the present exemplary embodiment) or more pre-strained MQW GaN/InGaN sets and the AlGaN ISCL separating these sets, the emission wavelength of III-nitride LEDs can be extended to amber and red region with high spectral purity and high output power.

In a preferred embodiment of this invention, the light emitting region of the III-nitride light emitting structure of this invention comprises one or more III-nitride barrier layers and lower indium multiple quantum well layers ($1^{st}$ MQW set), a $1^{st}$ ISCL containing one or more III-nitride barrier layers and moderate indium multiple quantum well layers ($2^{nd}$ MQW set), a $2^{nd}$ ISCL, one or more barrier layers and high indium containing multiple quantum well layers emitting amber-to-red light ($3^{rd}$ MQW set), and a top barrier layer, wherein each of the barrier layers is mainly comprised of GaN; each of the indium containing quantum well layers is comprised of InGaN; and each of the ISCLs is comprised of AlGaN.

In a first aspect of the invention, a multilayer III-nitride semiconductor LED is disclosed which may comprise a first, second and third set of layered MQW sets. The first set may comprise a first indium concentration. The second set may comprise a second indium concentration that is greater than the first indium concentration. The third set may comprise a third indium concentration that is greater than the second indium concentration. At least one of the first and second sets may be configured to function as a pre-strain layer. A first intermediate strain compensation layer may be provided and may be comprised of $Al_xGa_{1-x}N$ ($0<x\le1$) that is disposed between the first and second sets. A second intermediate strain compensation layer may be provided and may be comprised of $Al_xGa_{1-x}N$ ($0<x\le1$) that is disposed between the second and third sets. The first and second intermediate strain compensation layers may be disposed between two barrier layers and the third set may be configured to emit light having a wavelength ranging from about 600 nm to about 660 nm in the amber-to-red visible range.

In a second aspect of the invention, the first indium concentration may be less than about 17%.

In a third aspect of the invention, the second indium concentration may be greater than about 20%.

In a fourth aspect of the invention, the third indium concentration may be greater than about 30% and may be configured to emit amber-to-red light having a wavelength ranging from about 600 nm to about 660 nm.

In a fifth aspect of the invention, at least one of the intermediate strain compensation layers may comprise $Al_xGa_{1-x}N$ with x value larger than 0 and less or equal to 1.

In a sixth aspect of the invention, the Al concentration in at least one of the intermediate strain compensation layers may be varied and the first intermediate strain compensation layer may comprise a higher Al concentration than the second intermediate strain compensation layer.

In a seventh aspect of the invention, at least one of the barrier layers may be comprised of GaN, and at least one of the sets may be comprised of InGaN, and at least one of the intermediate strain compensation layers may be comprised of $Al_xGa_{1-x}N$ ($0<x\le1$).

In an eighth aspect of the invention, a method of manufacturing a III-nitride semiconductor LED which emits amber-to-red light, is disclosed comprising steps of defining a first barrier layer, defining a first set of MQW sets comprising a first indium concentration on the first barrier layer, defining a second barrier layer on the first set, defining a first intermediate strain compensation layer comprised of $Al_xGa_{1-x}N$ ($0<x\le1$) on the second barrier layer, defining a third barrier layer on the first intermediate-strain compensation layer, defining a second set of MQW sets comprising a second indium concentration that is greater than the first indium concentration on the third barrier layer, defining a fourth barrier layer on the second set, defining a second intermediate-strain compensation layer comprised of $Al_xGa_{1-x}N$ ($0<x\le1$) on the fourth barrier layer, defining a fifth barrier layer on the second intermediate-strain compensation layer, and, defining a third set of MQW sets comprising a third indium concentration that is greater than the second indium concentration configured to emit light having a wavelength ranging from about 600 nm to about 660 nm.

In a ninth aspect of the invention, at least one of the barrier layers made by the method may be comprised of GaN, at least one of the sets may be comprised of InGaN, the first intermediate-strain compensation layer may comprise a higher Al concentration than the second intermediate-strain compensation layer, the first set may comprise indium concentration not greater than about 17%, the second set may comprises an indium concentration greater than about 20% and the third set may comprise an indium concentration greater than about 30% for emitting amber-to-red light.

The present invention provides an innovative LED device and method for manufacturing III-nitride solid state light emitting structures, such as LEDs or LDs, that emit amber-to-red wavelength light. The III-nitride solid state light emitter is epitaxially grown using the methods of this invention and thus uniquely achieves amber and red wavelength light emission that exhibit high output power and high spectral purity and is free of the phase separation that plagues prior art III-nitride light emitting structures at long wavelengths.

The III-nitride semiconductor amber-to-red wavelength light emitter of this invention is described herein within the context of the LED device structure illustrated in FIG. 1 as an illustrative exemplary embodiment of the present invention. FIG. 1 shows a cross sectional view of a portion of an illustrative embodiment of the amber-to-red III-nitride LED 10 according to the present invention. The amber-to-red III-nitride LED device 10 can be manufactured by conventional epitaxial methods, for example metalorganic vapor phase epitaxy (MOVPE), also known as metalorganic chemical vapor deposition (MOCVD). As shown in FIG. 1, a GaN buffer layer 2 of approximately 2 μm is grown on a substrate 1, for example a sapphire substrate, with a nucleation layer (not shown) interposed in between. An approximately 3 μm thick n-type GaN cladding layer 3 doped with Si is grown on the GaN buffer layer 2. The illustrative embodiment of the amber-to-red III-nitride LED 10 can be epitaxially grown in either a polar, semi-polar or non-polar crystallographic orientation using a suitable substrate 1 crystallographic orientation.

Referring to FIG. 1, the III-nitride LED structure comprises a light emitting region or a multiple quantum well (MQW) active region 4 which comprises indium-containing III-nitride semiconductor layers which are grown on the n-type GaN cladding layer 3. As illustrated in FIG. 1, the active region 4 may comprise three types of MQW sets with indium concentration progressively increased from bottom $4_A$ MQW set to the top MQW set $4_H$. Each MQW set includes one or more 2-3 nm thick (it could be thicker depending on the crystallographic orientation) InGaN quantum well layers ($4_{A2}, \ldots, 4_{E2}, \ldots, 4_{H2} \ldots$) and one or more 5-20 nm thick barrier layers ($4_{A1}, \ldots, 4_B, 4_{E1}, \ldots, 4_F, 4_{H1}, \ldots, 4_I$) mainly comprised of GaN, which are alternatively stacked one on another with each InGaN quantum well layer being sandwiched between two barrier layers. Accordingly, as shown in FIG. 1, the MQW sets $4_A$, $4_E$ and $4_H$ may be vertically stacked to produce a multilayer stack of MQW sets 4. The III-nitride based barrier layers ($4_{A1}, \ldots, 4_B, 4_{E1}, \ldots, 4_F, 4_{H1}, \ldots, 4_I$) may include additional amounts of indium and/or aluminum as needed in order to adjust the quantum confinement levels of their respective quantum well layers ($4_{A2}, \ldots, 4_{E2}, \ldots, 4_{H2} \ldots$). The indium concentration for the 1$^{st}$ MQW set $4_A$ and the 2$^{nd}$ MQW set $4_E$, are preferably in the range of 7-13% and 20-25%; respectively, in the illustrated example. The first two MQW sets $4_A$ and $4_E$ produce a pre-strain effect for the top MQW set $4_H$, which may contain indium concentrations larger than 30% as preferred for amber-to-red light emission.

In one embodiment of this invention, high indium concentration is achieved without incurring phase separation by careful control of the strain of the high indium-containing quantum well layers ($4_{H2}, \ldots$) of the top MQW set $4_H$ of the III-nitride amber-to-red light emitting structure of FIG. 1. In this embodiment, introducing the lower two MQW sets $4_A$ and $4_E$ with indium concentrations progressively elevated generates a pre-strain effect on the barrier layers thus facilitating high indium intake within the upper most MQW set $4_H$. It is emphasized that the inclusion of only one or even two MQW sets with low indium concentration within the III-nitride light emitting structure may not produce a fully functional III-nitride semiconductor LED emitting at amber-to-red region with high spectral purity and high output power. Therefore, according to another embodiment of this invention and as shown in FIG. 1, the intermediate strain compensation layers (ISCLs) $4_C$ and $4_G$ are inserted in between each two successive MQW sets.

The ISCLs are sandwiched between the barrier layers of each two successive MQW sets and are preferably composed of $Al_xGa_{1-x}N$ (0<x≤1) alloys with varied Al concentration x in the range of about 17% to about 25%. The thickness and Al concentration in the ISCLs $4_C$ and $4_G$ are preferably different. In one embodiment of this invention, the Al concentration x in the lower ISCL $4_C$ may be higher than that of the upper ISCL $4_G$ in order to prevent layers from cracking and to avoid excessive series resistance of LED device 10 because of those layers. In another embodiment of this invention, the Al concentration x in the lower ISCLs $4_C$ may be lower than that of the upper ISCL $4_G$ in order to suppress carrier injection into the lower two low-indium concentration MQW sets $4_A$ and $4_E$ in favor of promoting higher levels of carrier injection into the high-indium concentration top MQW set $4_H$ thereby increasing the ratio of LED device light emission from the top MQW set $4_H$ and thus reducing the full width at half maximum (FWHM) of the amber-to-red light emission of the III-nitride semiconductor light emitter of this invention. In general, the Al concentration is varied ISCL to ISCL, though alternatively, the Al concentration in an individual intermediate strain compensation layer may be varied within that intermediate strain compensation layer, in discrete steps (graded) within the layer, or as a continuous variation in the respective layer.

A person skilled in the art will recognize the use of the aforementioned methods of this invention to select the most appropriate thickness and Al concentration in the ISCLs $4_C$ and $4_G$ depending upon the target performance parameters of the amber-to-red light emission of the III-nitride semiconductor light emitter.

Referring back to FIG. 1, overlying MQW active regions 4 of LED device 10 are p-type layers having a combined thickness of about 200 nm, respectively and including a Mg-doped AlGaN electron blocking layer (EBL) 5, a Mg-doped GaN cladding layer 6 and Mg-doped GaN contact layer 7. The atomic concentration of Mg in the p-type AlGaN and GaN cladding layer are preferably in the range from 1E19 $cm^{-3}$ to 1E20 $cm^{-3}$, for example. The Mg atomic concentration in p-type GaN contact layer is preferably in the range of 1E21 $cm^{-3}$, for example.

As in prior art III-nitride light emitters, the III-nitride semiconductor amber-to-red light emitting device of this invention is formed by first depositing on the top side p-GaN layer 7 of the epitaxially processed wafer, an ohmic contact metal stack to form the p-side electrode 8 then etching lateral trenches to expose n-GaN layer 3, then depositing within the etched trenches, an ohmic contact metal stack to form the n-side electrode 9. The epitaxially processed wafer is then diced to form individual LED chips, each having substantially the cross-section illustrated in FIG. 1, which are subsequently packaged and wire-bonded to the respective p-electrodes and n-electrodes to form the LED device of the invention. For lab testing, a p-side electrode (or ohmic contact metal stack) 8, for example, and indium ball (for simplicity in quick-test) is formed on the p-type GaN contact layer 7.

Additionally, one lateral portion of the device 10 is etched out from the p-type GaN contact layer 7 to a portion of the n-type GaN clad layer 3. Then an n-side electrode (or ohmic contact metal stack) 9, for example, indium ball (for simplicity in quick-test) is formed on the exposed portion of n-type GaN clad layer.

Under electrical current injection through the positive p-side electrode 8 to the n-side electrode 9, through the electron and hole recombination process, visible light is emitted from active region 4. The III-nitride semiconductor LED device 10 that is epitaxially grown in accordance with the methods of this invention is preferably configured such that only the top MQW set $4_H$ emits light while the bottom two MQW sets $4_A$ and $4_E$ function mainly as pre-strain layers. A III-nitride semiconductor LED device 10 with ~1 mm$^2$ area emitting light within the amber-to-red (amber-red) visible spectrum region under electric current injection of about 30 mA emits strong amber-red emission.

Figure 2A:
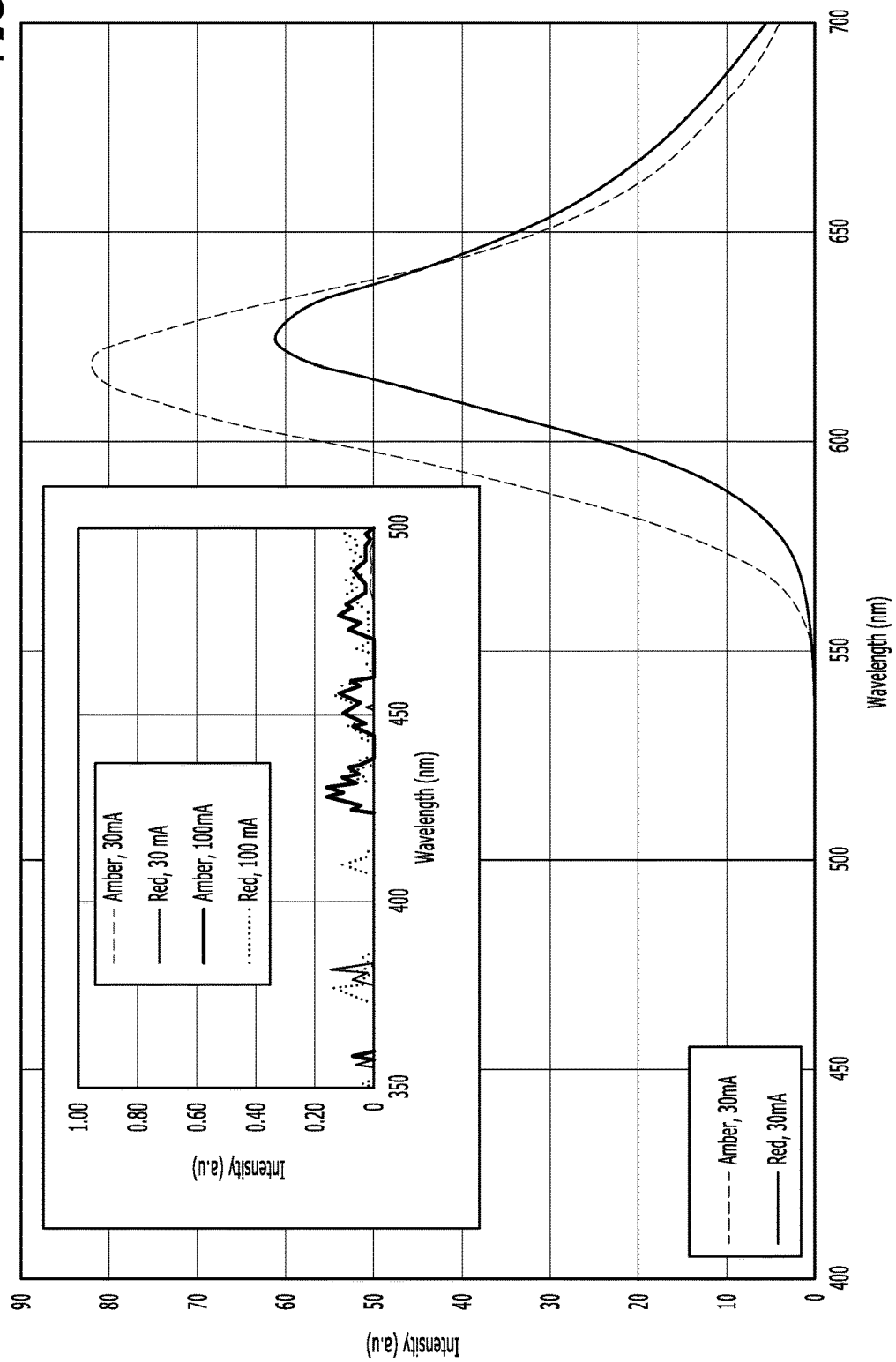
FIG. 2a is a graph illustrating the EL spectrum of the III-nitride semiconductor LED device 10 of FIG. 1 emitting amber and red light at a current injection of 30 mA. The inset shows the EL spectra of both amber and red LEDs 10 of FIG. 1 within the short wavelength spectral region at 30 and 100 mA injection currents.
Figure 2C:
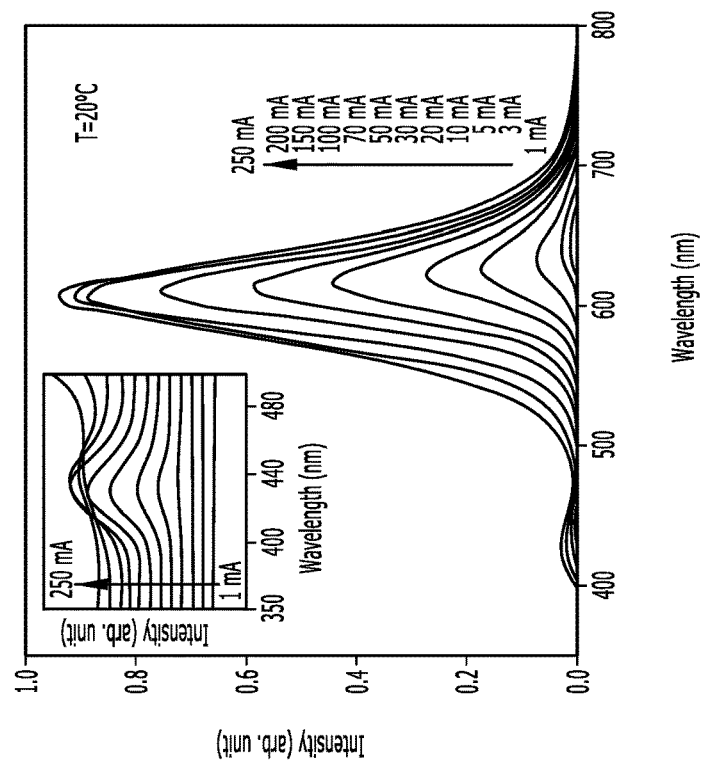
FIG. 2c shows the current dependent EL spectra in a prior art: App. Phys. Express 7, 071003 (2015).
Figure 2B:
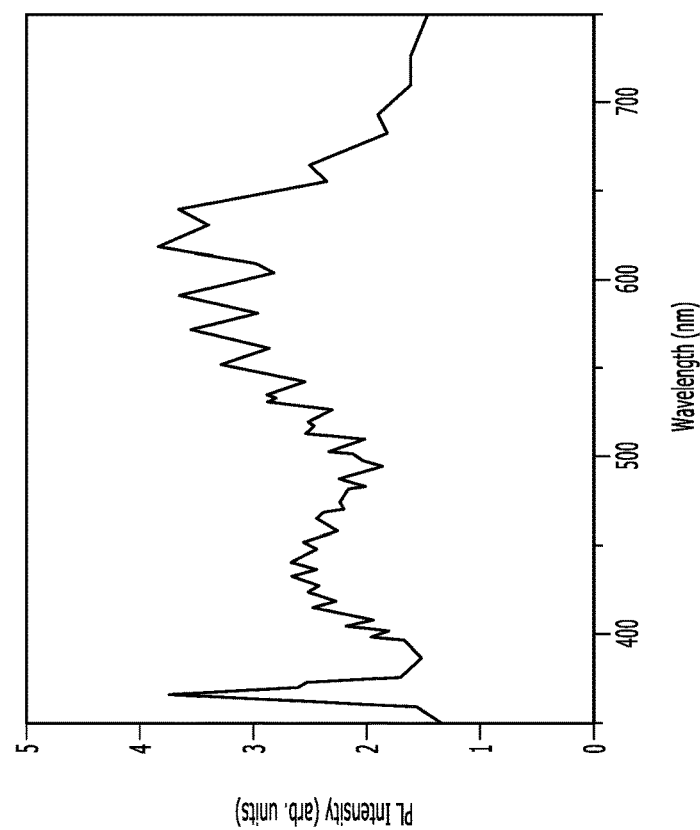
FIG. 2b shows the photoluminescence (PL) spectrum in a prior art: U.S. Pat. App. Publ. 20110237011A1.

FIG. 2a is a graph illustrating the typical EL spectra for amber-red LEDs 10 of FIG. 1 driven at about 30 mA. The inset shows the EL spectra of both amber and red exemplary embodiments of the III-nitride LED 10 of FIG. 1 of this invention at the short wavelength spectral region at 30 and 100 mA injection currents. As seen in the inset of FIG. 2(a), there are no additional peaks at shorter wavelength regions even under a higher driving current of 100 mA, suggesting no phase separation in the LEDs of the invention. On the contrary, as shown in FIGS. 2b and 2c which illustrate prior art LED performance, phase separation-induced additional emission peaks (~440 nm) and substantially wider FWHM emissions are readily observed in prior art LEDs: U.S. Pat. Application 20110237011A1 and App. Phys. Express 7, 071003 (2015); respectively.

Figure 3:
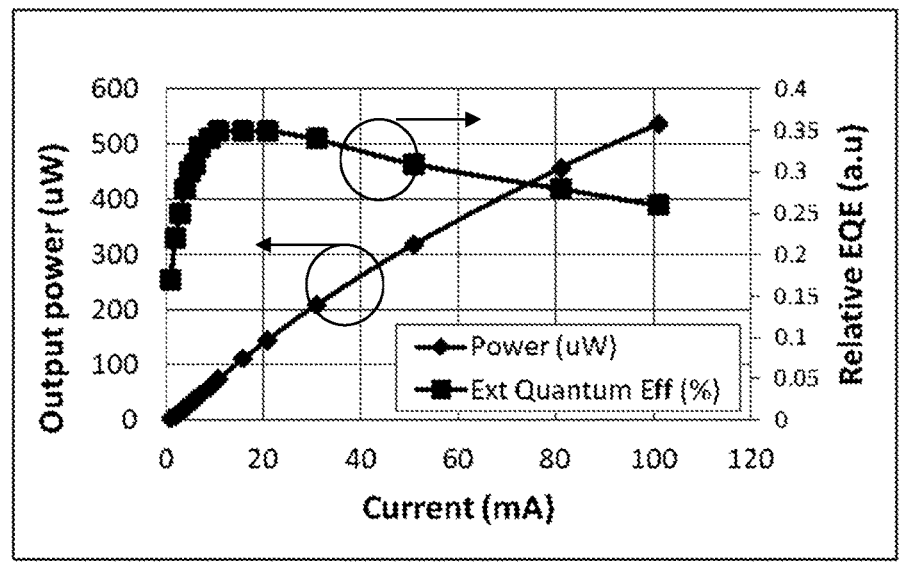
FIG. 3 is a graph illustrating the output power and relative EQE as a function of current for the III-nitride semiconductor LED device 10 of FIG. 1 emitting red light (measurements performed in an on-wafer configuration).
Figure 4:
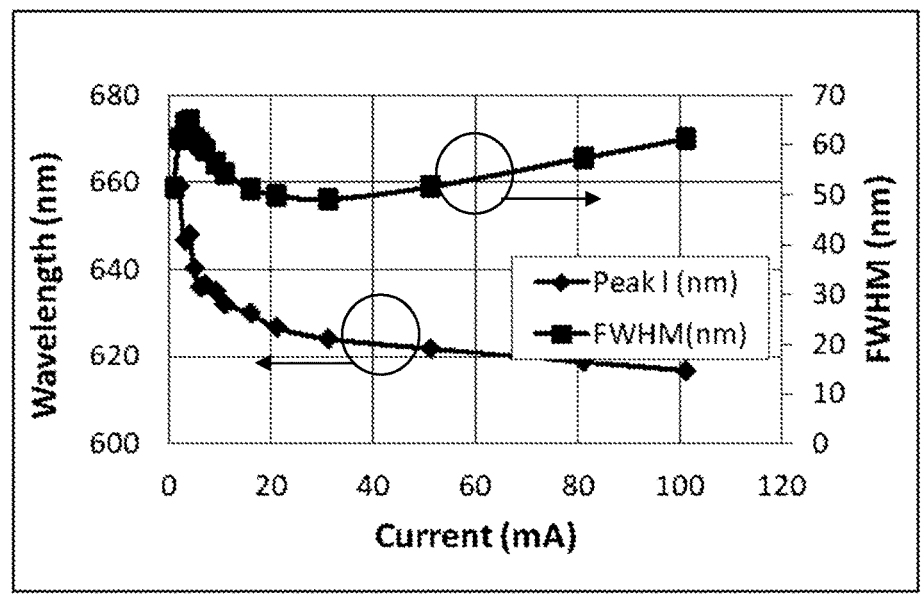
FIG. 4 is a graph illustrating the peak wavelength shift and full width at half maximum (FWHM) as a function of current for the III-nitride semiconductor LED device 10 of FIG. 1 emitting red light.

FIG. 3 through FIG. 6 demonstrate the performance of the amber-red III-nitride light emitter 10 of this invention; FIG. 3 and FIG. 4 demonstrating the performance of one exemplary embodiment of this invention whereby the device 10 active region 4 was designed for red (~625 nm) light emission (~45% indium concentration), while FIG. 5 and FIG. 6 demonstrate the performance of another exemplary embodiment of this invention with the device 10 active region structure designed for amber (~615 nm) light emission (~40% indium concentration).

FIG. 3 is a graph illustrating the measured current dependence of output power and relative EQE for a red emission III-nitride LED device 10 of this invention having its active region 4 designed to peak at red (~625 nm) light emission. All measurements are performed in an on-wafer test configuration with indium balls as both p-side and n-side electrodes 8 and 9, respectively. No special surface treatments and/or cooling units were used to conduct the illustrated testing. The light was collected by an integrating sphere placed underneath LED 10 therefore not all light was collected. As shown in FIG. 3, the output power increases with applied current following a power rule as is observed in other III-nitride semiconductor based LEDs. At 30 mA, the output power of red III-nitride semiconductor LED 10 reaches about 211 µW. The relative EQE of the red III-nitride semiconductor LED 10 peaks at about 35% at around 11 mA and then starts to drop monotonically with increasing current. At 100 mA, the relative EQE was reduced by about 26% compared to the peak value. The true mechanism for the EQE reduction with increasing currents is still not well understood in LED design community. There are basically two explanations for this phenomena: (1) Auger recombination; and (2) electron leakage due to insufficient hole transport which detailed description is beyond the scope of this disclosure.

FIG. 4 is a graph illustrating an example of the measured emission peak wavelength shift and FWHM with current for the red III-nitride LED 10 of FIG. 1. The emission peak wavelength shows a blue shift with increasing injection current. This behavior is a characteristic of the carrier screening of the piezoelectric field in III-nitride based semiconductor LEDs. The band-filling effect is also another cause for the blue shift. The emission peak wavelength shifts at low current due to strong band-filling but gradually saturates to 617 nm at 100 mA. At 30 mA, the emission peak wavelength is 625 nm (red) and the FWHM reaches a minimum value of 49 nm at the same current level for a device with ~1 mm$^2$ area. To the best of the Applicant's knowledge, this illustrates the best red emission performance from III-nitride light emitter achieved to date.

Figure 5:
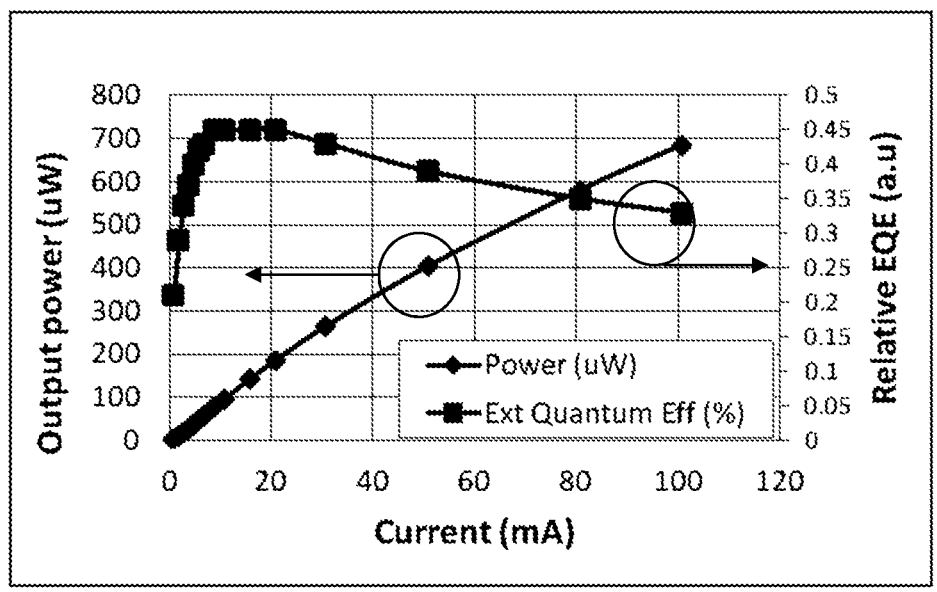
FIG. 5 is a graph illustrating the output power and relative EQE as a function of current for the III-nitride semiconductor LED device 10 of FIG. 1 emitting amber light.

FIG. 5 is a graph illustrating the current dependence of output power and relative EQE of the III-nitride semiconductor LED device 10 of FIG. 1 of this invention having its active region 4 designed to peak at amber light emission. In a similar behavior as that of the red III-nitride semiconductor LED of the previous exemplary embodiment, for a device with ~1 mm$^2$ area, the relative EQE of the amber III-nitride semiconductor LED peaks to 45% at around 9 mA and reduces to about 33% at 100 mA. The measured output power for amber III-nitride LED was about 266 µW at 30 mA.

Figure 6:
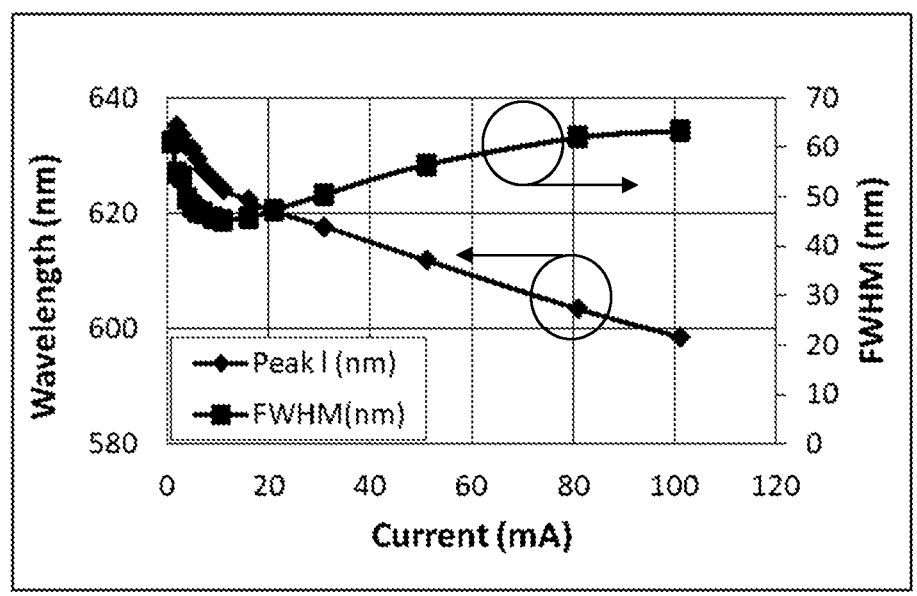
FIG. 6 is a graph illustrating the peak wavelength shift and FWHM as a function of current for the III-nitride semiconductor LED device 10 of FIG. 1 emitting amber light.

FIG. 6 is a graph illustrating an example of the measured variations in emission peak wavelength and FWHM with applied current for the amber III-nitride semiconductor LED 10 of FIG. 1. Following the similar trend as red III-nitride LED, the wavelength shifts at low current but gradually saturated to 599 nm at 100 mA. At 30 mA, the peak wavelength is 617 nm (amber) with a FWHM 54 nm.

As described in the preceding paragraphs, III-nitride semiconductor LEDs emitting amber-to-red light with high output power and high spectra purity, according to the present invention, can be readily manufactured by careful control on the material strain. The epitaxial growth methods are compatible with the techniques to obtain III-V compound semiconductors. Suitable epitaxial deposition techniques for use in practicing the present disclosure include, but are not limited to, MOVPE, molecular beam epitaxy (MBE), and hydride vapor phase epitaxy (HVPE). The III-nitride-based semiconductor layers can, for instance, be comprised of $Al_xGa_yIn_{1-x-y}N$, where $0 \leq x \leq 1$ and $0 \leq y \leq 1$. The plane orientation of the substrate 1 could be either c-plane, semi-polar and non-polar crystalline planes.

Moreover, the LED device 10 according to the present disclosure can be readily fabricated utilizing conventional III-V compound semiconductor manufacturing methodologies and technologies.

While the forgoing disclosure has been described in a way of example, it is to be understood that the disclosure is not limited to thereto. It meant to include a wide range of modifications and similar arrangements. Modifications of the features or components of the present disclosure can be made without deviating from the core concept of the present disclosure. As a result, the scope of the present disclosure is not to be limited by the foregoing description, but only by the appended claims as expressed herein.

What is claimed is:

1. A III-nitride semiconductor LED comprising:
a plurality of multiple quantum well sets stacked on a substrate, the plurality of multiple quantum well sets including a first, a second, and a top multiple quantum well set;
the first multiple quantum well set being adjacent the substrate and having a low indium concentration;
each multiple quantum well set above the first multiple quantum well set having a progressively increased indium concentration;
the top multiple quantum well set having a highest indium concentration selected to emit light in the amber-to-red visible spectra region; and
adjacent multiple quantum well sets being separated by an $Al_xGa_{1-x}N$ (0<x≤1) intermediate strain compensation layer, each $Al_xGa_{1-x}N$ (0<x≤1) intermediate strain compensation layer having a barrier layer above and below the respective $Al_xGa_{1-x}N$ (0<x≤1) intermediate strain compensation layer to reduce total strain in the top multiple quantum well set,
wherein an Al concentration in the $Al_xGa_{1-x}N$ (0<x≤1) intermediate strain compensation layers is varied with the $Al_xGa_{1-x}N$ (0<x≤1) intermediate strain compensation layer closest to the substrate having higher Al concentration than the other $Al_xGa_{1-x}N$ (0<x≤1) intermediate strain compensation layers.

2. The III-nitride semiconductor LED according to claim 1, further comprising:
a barrier layer below the first multiple quantum well set;
an electron blocking layer above the top multiple quantum well set;
a cladding layer above the electron blocking layer; and
a contact layer above the cladding layer.

3. The III-nitride semiconductor LED according to claim 1, wherein the first and second multiple quantum well sets generate a pre-strain effect.

4. The III-nitride semiconductor LED of claim 1 wherein the plurality of multiple quantum well sets stacked on the substrate comprise three or more multiple quantum well sets stacked on the substrate.

5. The III-nitride semiconductor LED according to claim 4, wherein the first multiple quantum well set with the low indium concentration has an indium concentration of not more than 17%.

6. The III-nitride semiconductor LED according to claim 4, wherein the multiple quantum well sets between the first multiple quantum well set and the top multiple quantum well set have indium concentrations greater than 20%.

7. The III-nitride semiconductor LED according to claim 4, wherein the top multiple quantum well set has an indium concentration of greater than 30%.

8. The III-nitride semiconductor LED according to claim 4 wherein the Al concentration in at least one of the $Al_xGa_{1-x}N$ (0<x≤1) intermediate strain compensation layers is varied within that layer in discrete steps or in a continuous variation.

9. The III-nitride semiconductor LED according to claim 4, wherein each of the barrier layers above and below the respective $Al_xGa_{1-x}N$ (0<x≤1) intermediate strain compensation layer is comprised of GaN and each of the multiple quantum well sets is comprised of InGaN.

10. A method of forming a III-nitride semiconductor LED comprising:
forming over a substrate an active region having a plurality of sets of multiple quantum wells by;
forming over the substrate, the first set of multiple quantum wells having an indium concentration;
forming at least two additional sets of multiple quantum wells over the first set of multiple quantum wells, the formation of each additional set of multiple quantum wells being preceded by the formation of an $Al_xGa_{1-x}N$ (0<x≤1) intermediate strain compensation layer over the preceding set of multiple quantum wells such that a first $Al_xGa_{1-x}N$ (0<x≤1) intermediate strain compensation layer and a second $Al_xGa_{1-x}N$ (0<x≤1) intermediate strain compensation layer are formed;
the at least two additional set of multiple quantum wells having a higher indium concentration than the first set of multiple quantum wells; and
the first $Al_xGa_{1-x}N$ (0<x≤1) intermediate strain compensation layer closest to the substrate containing a higher Al concentration than the second $Al_xGa_{1-x}N$ (0<x≤1) intermediate strain compensation layer.

11. The method of claim 10 wherein the indium concentration for the at least one additional set of multiple quantum wells is selected for emitting amber-to-red light.

12. The method of claim 10 wherein the at least one additional set of multiple quantum wells is at least 2 including a second set of multiple quantum wells formed over the first set of multiple quantum wells and a third set of multiple quantum wells formed over the second set of multiple quantum wells, wherein the third set of multiple quantum wells has a higher indium concentration than the second set of multiple quantum wells.

13. The method of claim 12 further comprising:
forming barrier layers above and below each $Al_xGa_{1-x}N$ (0<x≤1) intermediate strain compensation layer, and wherein each of the barrier layers is comprised of GaN and each of the multiple quantum well sets is comprised of InGaN;
the first set of multiple quantum wells having an indium concentration not greater than 17%, the second set of multiple quantum wells having an indium concentration greater than 20% and the third set of multiple quantum wells having an indium concentration larger than 30%.

14. A multilayer III-nitride semiconductor LED comprising:
first, second and third layered multiple quantum well sets stacked on a substrate in ascending order with the first layered multiple quantum well set closest to the substrate;
the first layered multiple quantum well set having a first indium concentration;
the second layered multiple quantum well set having a second indium concentration that is greater than the first indium concentration;
the third layered multiple quantum well set having a third indium concentration that is greater than the second indium concentration;
a first intermediate strain compensation layer comprised of $Al_xGa_{1-x}N$ (0<x≤1) disposed between the first and second layered multiple quantum well sets;
a second intermediate strain compensation layer comprised of $Al_xGa_{1-x}N$ (0<x≤1) disposed between the second and third layered multiple quantum well sets;
the first and second intermediate strain compensation layers each being disposed between two barrier layers; and the third layered multiple quantum well set being configured to emit light having a peak emission at a wavelength ranging from approximately 600 nm to approximately 660 nm, wherein the first intermediate strain compensation layer comprises a higher Al concentration than the second intermediate strain compensation layer.

15. The multilayer III-nitride semiconductor LED according to claim 14, wherein the first indium concentration is less than approximately 17%.

16. The multilayer III-nitride semiconductor LED according to claim 14, wherein the second indium concentration is greater than approximately 20%.

17. The multilayer III-nitride semiconductor LED according to claim 14, wherein the third indium concentration is greater than approximately 30% and is selected to cause the third layered multiple quantum well set to emit the amber-to-red light.

18. The multilayer III-nitride semiconductor LED according to claim 14, wherein the $Al_xGa_{1-x}N$ ($0<x\le1$) composition in at least one of the intermediate strain compensation layers is varied.

19. The multilayer III-nitride semiconductor LED according to claim 14 wherein the Al concentration in at least one of the $Al_xGa_{1-x}N$ ($0<x\le1$) intermediate strain compensation layers is varied within that layer in discrete steps or in a continuous variation.

20. The multilayer III-nitride semiconductor LED according to claim 14, wherein at least one of the barrier layers is comprised of GaN, and wherein at least one of the layered multiple quantum well sets is comprised of InGaN.

21. A method of manufacturing a III-nitride semiconductor LED which emits amber-to-red light, comprising:
    defining a first barrier layer;
    defining a first layered multiple quantum well set comprising a first indium concentration on the first barrier layer;
    defining a second barrier layer on the first layered multiple quantum well set;
    defining a first intermediate strain compensation layer comprised of $Al_xGa_{1-x}N$ ($0<x\le1$) on the second barrier layer;
    defining a third barrier layer on the first intermediate-strain compensation layer;
    defining on the third barrier layer, a second layered multiple quantum well set comprising a second indium concentration that is greater than the first indium concentration;
    defining a fourth barrier layer on the second layered multiple quantum well set;
    defining a second intermediate strain compensation layer comprised of $Al_xGa_{1-x}N$ ($0<x\le1$) on the fourth barrier layer;
    defining a fifth barrier layer on the second intermediate strain compensation layer; and
    defining a third layered multiple quantum well set comprising a third indium concentration that is greater than the second indium concentration configured to emit light having a peak emission at a wavelength ranging from approximately 600 nm to approximately 660 nm,
    wherein the first intermediate strain compensation layer comprises a higher Al concentration than the second intermediate strain compensation layer.

22. The method of claim 21, wherein at least one of the barrier layers is comprised of GaN and wherein at least one of the layered multiple quantum well sets is comprised of InGaN and wherein the first layered multiple quantum well set comprises an indium concentration not greater than approximately 17% and wherein the second layered multiple quantum well set comprises an indium concentration greater than approximately 20% and wherein the third layered multiple quantum well set comprises an indium concentration greater than approximately 30%.

* * * * *